(12) United States Patent
Chakravarti et al.

(10) Patent No.: US 8,389,352 B2
(45) Date of Patent: Mar. 5, 2013

(54) SILICON GERMANIUM FILM FORMATION METHOD AND STRUCTURE

(75) Inventors: Ashima B. Chakravarti, Hopewell Junction, NY (US); Abhishek Dube, Fishkill, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/025,474

(22) Filed: Feb. 11, 2011

(65) Prior Publication Data

US 2012/0205749 A1 Aug. 16, 2012

(51) Int. Cl.
*H01L 21/8238* (2006.01)

(52) U.S. Cl. ......... 438/199; 438/197; 438/285; 438/514

(58) Field of Classification Search .................. 438/285, 438/197, 199, 514
See application file for complete search history.

(56) References Cited

U.S. PATENT DOCUMENTS

| | | | |
|---|---|---|---|
| 6,544,854 B1 | 4/2003 | Puchner et al. | |
| 6,600,170 B1 | 7/2003 | Xiang | |
| 7,056,835 B2 | 6/2006 | Pomarede et al. | |
| 7,176,481 B2 | 2/2007 | Chen et al. | |
| 7,227,205 B2 | 6/2007 | Bryant et al. | |
| 7,279,430 B2 | 10/2007 | Chang et al. | |
| 7,323,392 B2 | 1/2008 | Wang et al. | |
| 2005/0133819 A1 | 6/2005 | Kawasaki | |
| 2009/0294801 A1 | 12/2009 | Harley et al. | |
| 2010/0133626 A1* | 6/2010 | Aoyama et al. ................ 257/379 |

OTHER PUBLICATIONS

IP.com Technical Disclosure No. IPCOM000030145D, "Method for the complete or epitaxial metal silicidation of a MOSFET", Jul. 29, 2004.
Harame et al., Si/SiGe Epitaxial-Base Transistors—Part II: Process Integration and Analog Applications, IEEE Transactions on Electron Devices, vol. 42, No. 3, Mar. 1995, pp. 469-482.
U.S. Appl. No. 13/616,994, filed Sep. 14, 2012, Office Action dated Dec. 3, 2012.

* cited by examiner

*Primary Examiner* — Minchul Yang
(74) *Attorney, Agent, or Firm* — Katherine S. Brown; Hoffman Warnick LLC

(57) ABSTRACT

Epitaxial deposition of silicon germanium in a semiconductor device is achieved without using masks. Nucleation delays induced by interactions with dopants present before deposition of the silicon germanium are used to determine a period over which an exposed substrate surface may be subjected to epitaxial deposition to form a layer of SiGe on desired parts with substantially no deposition on other parts. Dopant concentration may be changed to achieve desired thicknesses within preferred deposition times. Resulting deposited SiGe is substantially devoid of growth edge effects.

15 Claims, 5 Drawing Sheets

SILICON GERMANIUM FILM FORMATION METHOD AND STRUCTURE

BACKGROUND

The present invention relates to semiconductor manufacture and, more specifically, to a method of integrating channel silicon germanium (SiGe) films in CMOS technology to improve CMOS device manufacture.

During semiconductor device manufacture, nucleation of one deposited material can occur at a different point than another, and different materials often exhibit different film growth rates over a given period of time. Interaction with dopants contributes to nucleation delay, different growth rates, and other effects, so that masks are used to cover one device region while material is deposited on another. The masks in some instances are then removed and material is deposited on other regions of the device, sometimes using additional masks. As a result of the presence of a mask during deposition, edge effects are typically observed in components formed from the deposited material. For example, in the manufacture of field effect transistors (FETs) employing layers or films of SiGe, epitaxial deposition of silicon germanium is delayed over NFET P well implant regions as compared to PFET N well implant regions. As a result, a hard mask of silicon nitride or silicon oxide is used to cover the NFET region during SiGe deposition on the PFET region, which results in edge effects in the deposited SiGe.

It may therefore be advantageous to deposit SiGe without the edge effects that result from the use of masks. Additionally, it may be advantageous to use the delay in nucleation induced by dopants in the manufacture of semiconductor devices as opposed to finding ways to overcome the delay.

BRIEF SUMMARY

According to one embodiment of the present invention, a semiconductor device manufacturing method comprises providing a substrate, doping a first region of the substrate with a first dopant in a first concentration, and defining a second region of the substrate, which may be doped with a second dopant in a second concentration. The first and second regions are then exposed to a silicon germanium deposition for a predetermined period. The period is determined responsive to at least one of the first and second concentrations so that a layer of SiGe forms on one of the first and second regions during the predetermined period with substantially no deposition of SiGe on the other of the first and second regions.

In addition, an embodiment includes a method to process a substrate comprising providing a substrate with an exposed surface, forming a first FET region in the exposed surface, and forming a second FET region in the exposed surface. The first FET region is then treated by doping source and drain regions of the first FET region to form a first doped area including the source and drain regions of the first FET. The exposed surface of the substrate is exposed to deposition of a material such that a layer of the material forms on one of the first doped area and the remainder of the exposed surface. Substantially no material is deposited on the other of the first doped area and the remainder of the exposed surface.

In embodiments, a semiconductor device structure comprises a first FET having a plug formed from an epitaxially deposited first material in a channel of the first FET and a second FET having a channel formed from the epitaxially deposited first material. The first material is deposited epitaxially devoid of growth edge effects.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
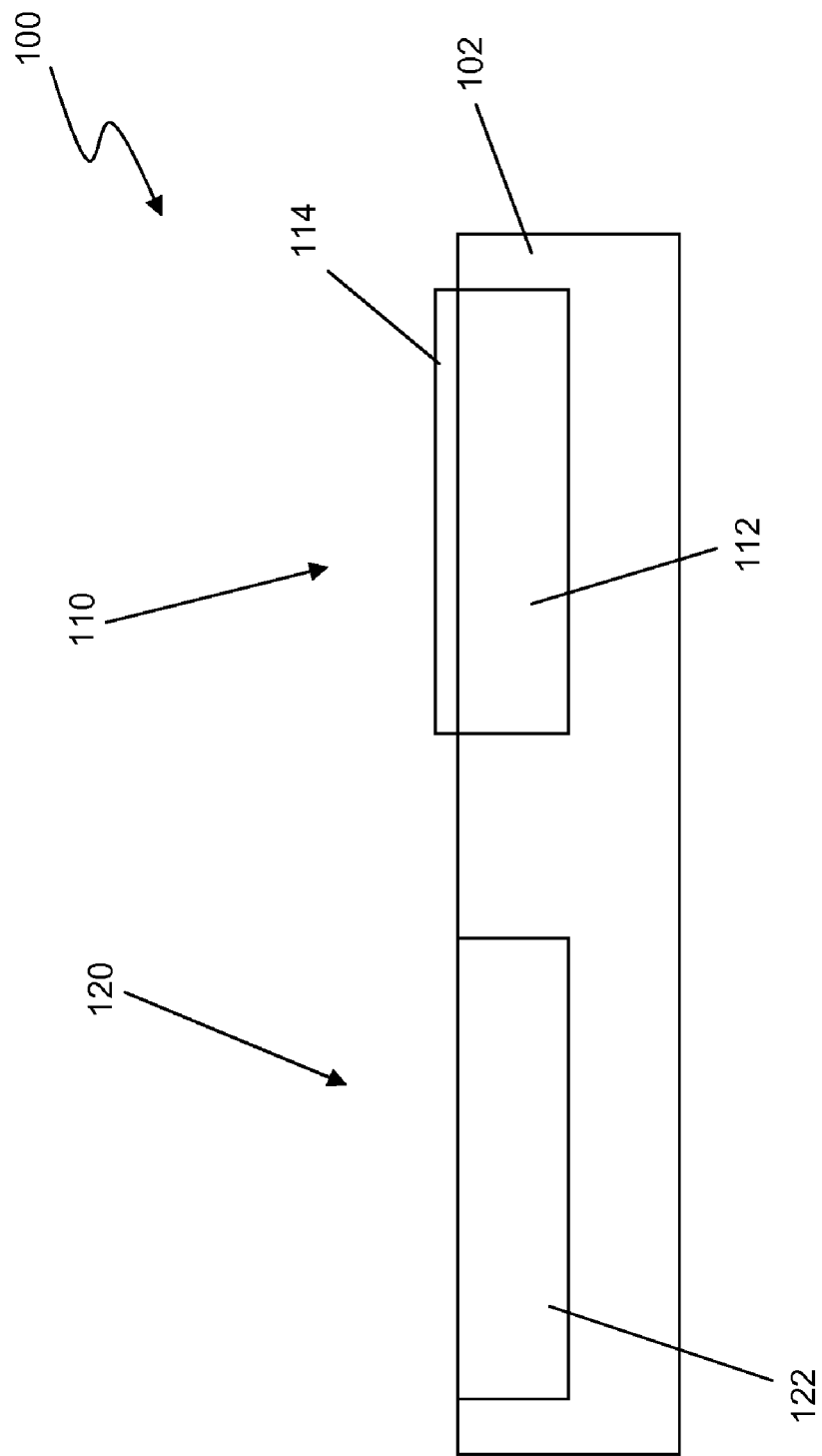
FIG. 1 is a schematic diagram of a semiconductor structure formed using a method of an embodiment.

With reference now to FIG. 1, a semiconductor device 100 is shown and in embodiments is made with a manufacturing method starting with providing a substrate 102. A first region 110 of substrate 102 may be doped with a first dopant 112 in a first concentration, and a second region 120 of substrate 102 may be doped with a second dopant 122 in a second concentration. In an embodiment, second region 120 is left undoped or is considered to have a zero concentration of second dopant 122. Doping may be performed using ion implantation or any other suitable technique now known or later discovered within the scope of the invention.

The first and second regions 110, 120 are exposed to another material, such as silicon germanium (SiGe), for a predetermined period of time to form a layer 114 of the material over desired portions of substrate 102, such as first region 110 doped with first dopant 112. The exposure to the material may be achieved by exposing substrate 102 to a stream of material, such as by using epitaxial deposition, or any other suitable technique now known or later discovered within the scope of the invention.

The period of exposure is determined responsive to the property(ies) of the dopant(s), the concentration(s) of the dopant(s), and/or interactions between substrate 102, the another material, such as SiGe as indicated above, and/or the dopant(s). With an appropriate predetermined period, a layer of, for example, SiGe forms on one of first and second regions 110, 120 during the predetermined period with substantially no deposition of SiGe on the other of first and second regions 110, 120. By tuning the concentration(s) of the dopant(s), desired thicknesses of up to about 100 Angstroms can be achieved over one region with substantially no deposition on other portions of substrate 102, particularly second region 120, all without the use of a mask. For example, if substrate 102 is silicon and first dopant 112 is boron in first region 110, a layer 114 of SiGe forms on the boron-doped region 110 during the predetermined period with substantially no deposition of SiGe on other regions, including second region 120. Similarly, for example, if substrate 102 is silicon, such as undoped mono- or poly-crystalline silicon, and one of the dopants is arsenic, substantially no SiGe is deposited on the arsenic-doped region during the predetermined period while a layer of SiGe forms on other regions.

Figure 2:
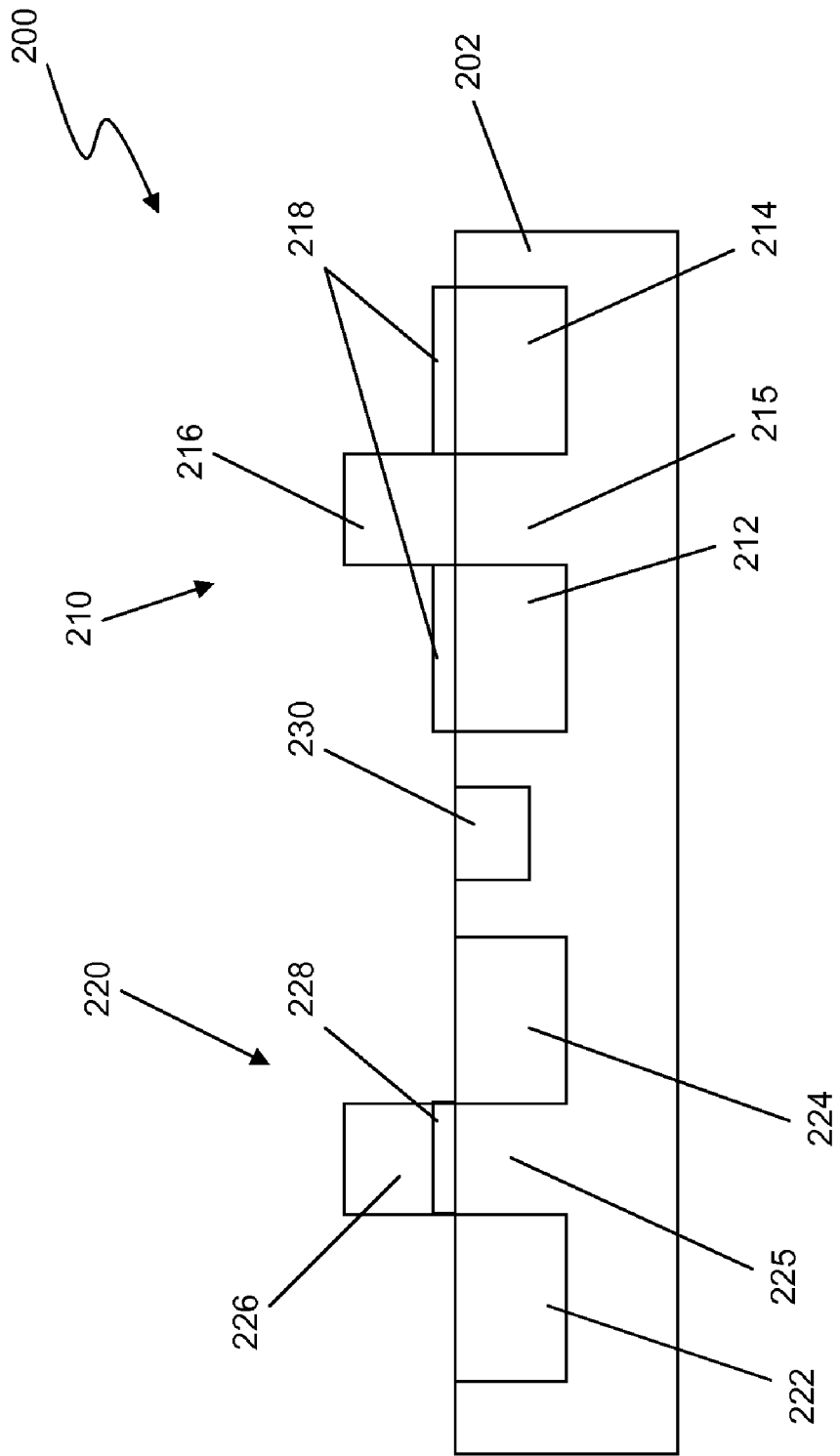
FIG. 2 is a schematic diagram of another semiconductor structure formed using a method of an embodiment.

This technique can be applied recursively, such that first and second regions 110, 120 may be parts of one or more larger devices formed on substrate 102. For example, as seen in FIG. 2, a semiconductor device 200 according to an embodiment of the invention disclosed herein may include first and second devices, such as first and second field effect transistors (FETs) 210, 220, formed on a substrate 202. First FET 210 includes first source and drain regions 212, 214, a first channel region 215, and a first gate region 216. Similarly, second FET 220 includes second source and drain regions 222, 224, a second channel region 225, and a second gate region 226. In an embodiment, one or both of the source and drain regions 212, 214 of first FET 210 may be construed as a first region doped with a first dopant, which may also be construed as including channel region 225 of second FET 220. Second region doped with a second dopant may be specific regions of the first and second FETs 210, 220 and similarly doped areas of the remainder of the exposed surfaces of the semiconductor device 200. Alternatively, the second region may be construed as including everything exposed of the semiconductor device 200 other than the first region, including areas doped with a second dopant, areas doped with additional dopants, and undoped areas. For example, first FET 210 may be a PFET with a first dopant being a P-type dopant, such as boron, in first source and drain regions 212, 214, while second FET 220 may be an NFET with a second dopant being an N-type dopant, such as arsenic, in second source and drain regions 222, 224. The deposited material, such as SiGe, in embodiments is used to form components of the FETs and/or sacrificial material for later processing. In the example above, SiGe forms a layer 218 on the P-doped, such as heavily P-doped, first source and drain regions 212, 214, but does not accumulate on other areas of the device 200. In addition, SiGe may form a plug 228 in second FET 220. An isolation region 230, such as a trench isolation region, may be formed to electrically separate first FET 210 from second FET 220.

As described above, an example of an embodiment has SiGe being deposited, such as via epitaxy, onto exposed surfaces of silicon substrate based semiconductor device 200, a P-type dopant, such as boron, as one dopant, and an N-type dopant, such as arsenic, as the other dopant. In this example, an appropriate predetermined period should be from about 15 seconds to about 30 seconds, or, more particularly, from about 20 seconds to about 25 seconds, such as about 22 seconds. The resulting layer of SiGe in such a case should be from about 5 Angstroms to about 25 Angstroms thick, or, more particularly, the layer of SiGe may be from about 10 Angstroms to about 20 Angstroms thick. Other predetermined times will be appropriate for other materials and/or desired thicknesses.

Figure 3:
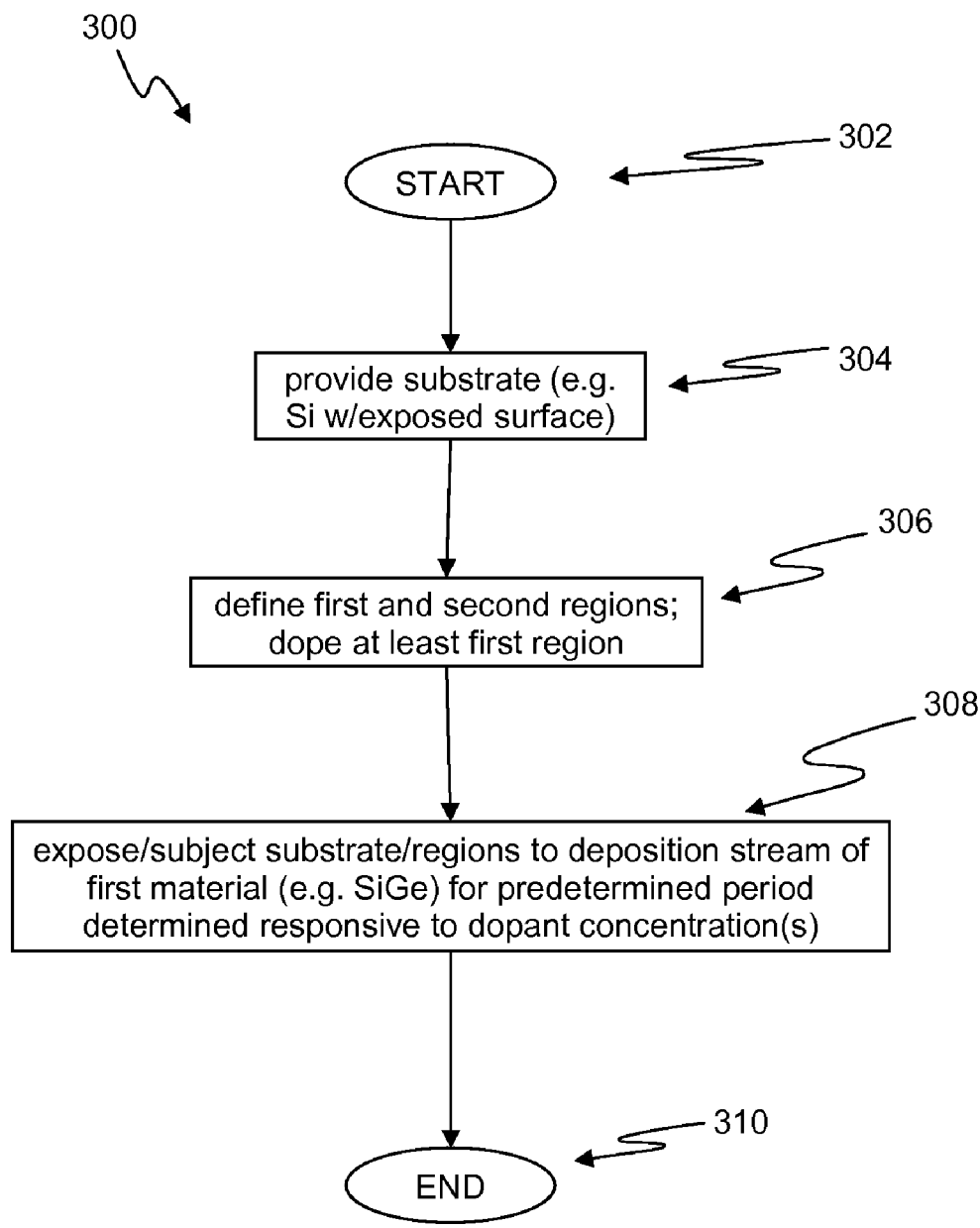
FIG. 3 is a schematic flow diagram of a method of an embodiment.

Referring now to FIG. 3, a method according to an embodiment of the invention disclosed herein is showed schematically. After the method 300 starts (block 302), a substrate is provided (block 304), having an exposed surface, and first and second regions are defined with at least a first doped area of the first region being doped (block 306). For example, the first and second regions can be first and second FET regions formed in the substrate and the first doped area can be source and drain regions of the first FET region. The exposed surfaces on substrate 102 are then subjected or exposed to a material, such as a deposition stream of SiGe, for a predetermined period responsive to at least the concentration of the first dopant (block 308). The material accumulates in a layer on one region while substantially none of the material accumulates on other areas of substrate 102, such as the second region. Because no mask is used, no edge effects are produced during deposition of the material, yielding improved operation and reduced loading of the deposited film in the finished semiconductor device.

Figure 4:
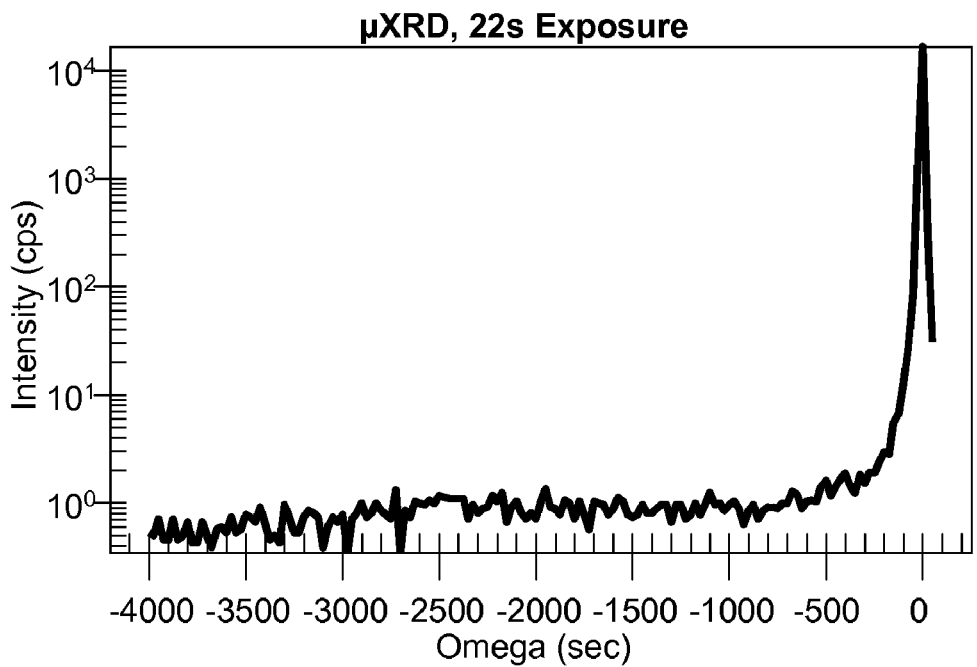
FIG. 4 is a graph showing germanium signal as a function of time over a first period for a P-typed doped region with which an embodiment is applied compared to prior art results.
Figure 5:
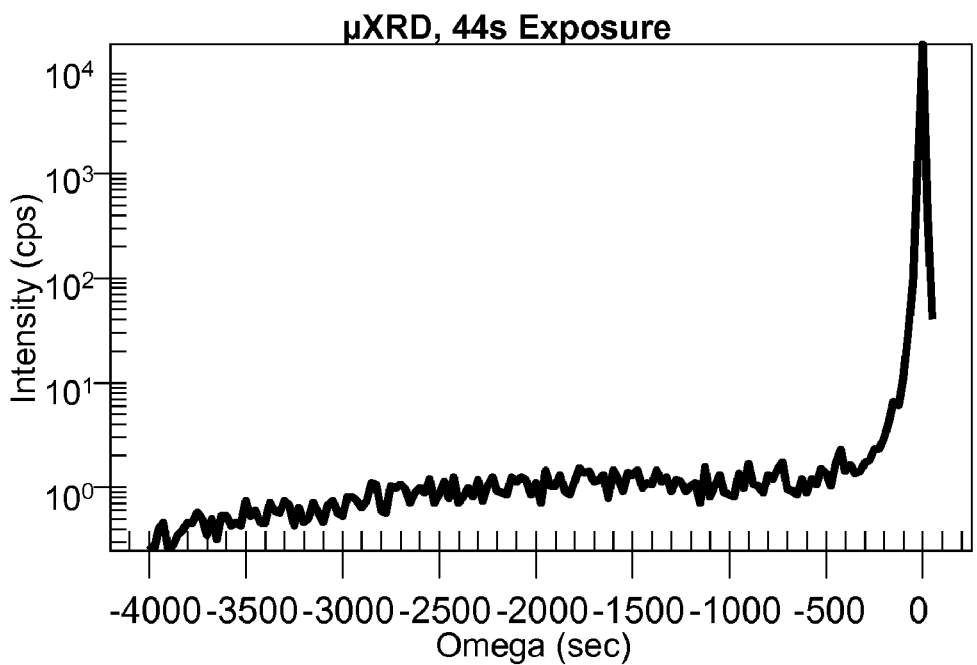
FIG. 5 is a graph showing germanium signal as a function of time over a second period for a P-typed doped region with which an embodiment is applied compared to prior art results.
Figure 6:
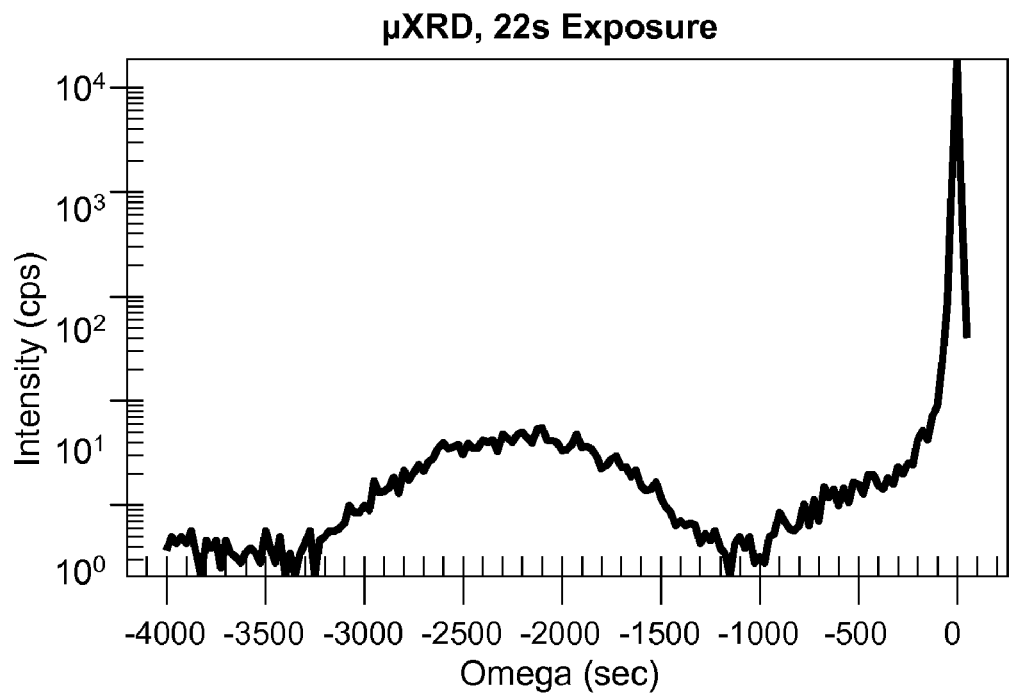
FIG. 6 is a graph showing germanium signal as a function of time over a first period for an N-type doped region with which an embodiment is applied compared to prior art results.
Figure 7:
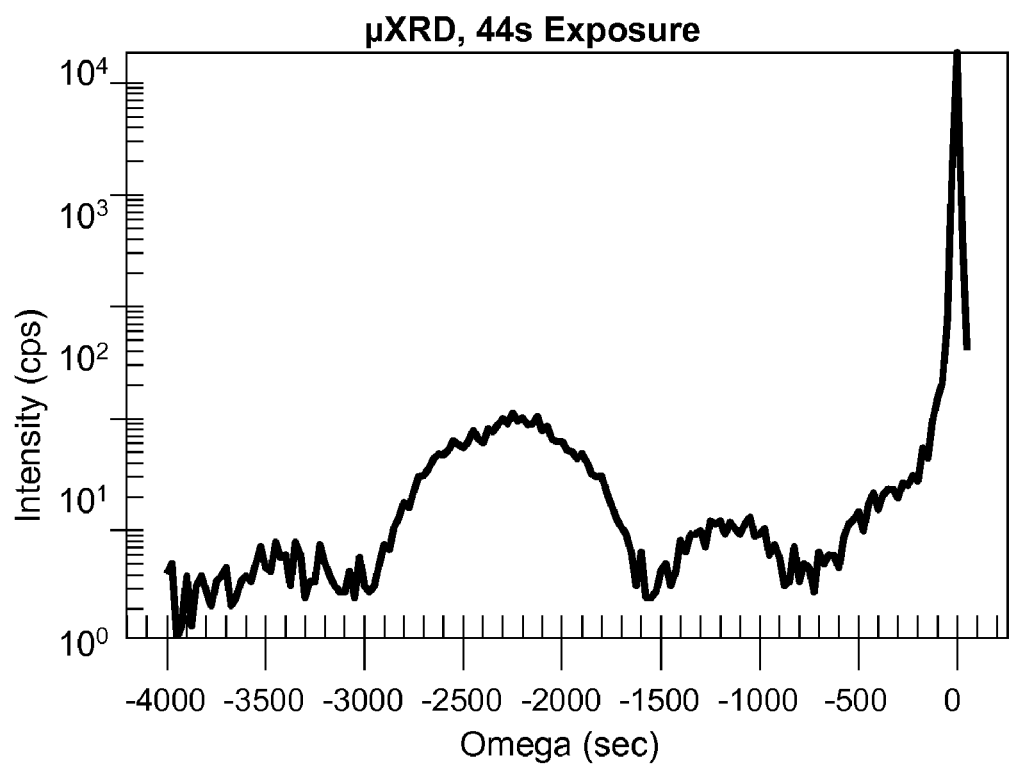
FIG. 7 is a graph showing germanium signal as a function of time over a second period for an N-type doped region with which an embodiment is applied compared to prior art results.

FIGS. 4-7 show comparisons of the results of application of embodiments of the instant invention for P-type and N-type dopants, respectively, using detected SiGe as a function of time for illustrative purposes. FIGS. 4-7 display representations of micro X-ray diffraction spectra for SiGe films grown on different types of substrates as a function of time according to embodiments. These data, typically referred to as rocking curves, may be used to calculate the thickness of the deposited epitaxial film, as well as concentration of the components of the material, as is known in the art. The position of the peak to the left of the origin in such curves may be used to calculate component concentration, which in this case is concentration of germanium as a percentage of the material of the film. The intensity of the peak and its width may be used to calculate thickness of the deposited epitaxial film in Angtroms (Å) using known techniques. FIGS. 4 and 5 show the spectra for SiGe deposition on a silicon substrate lightly doped, such as with less than about $1 \cdot 10^{18}$ dopant species/cm$^3$, with Boron (B) after 22 and 44 seconds of deposition, respectively. As derived from the curves seen in FIGS. 4 and 5, there is almost no deposition of SiGe after 22 seconds and less than about 20 Å of SiGe after 44 seconds. FIGS. 6 and 7 show the spectra for SiGe deposition on a silicon substrate lightly doped, such as with less than about $1 \cdot 10^{18}$ dopant species/cm$^3$, with Arsenic (As) after 22 and 44 seconds of deposition respectively. As derived from the curves shown in FIGS. 6 and 7, there is about 86 Å of SiGe deposited after 22 seconds and about 160 Å of SiGe deposited after 44 seconds. As can be seen, application of embodiments results in no to very thin deposition of SiGe for N-type doped substrates, such as lightly N-type doped substrates (FIGS. 4 and 5), and much thicker deposition of SiGe for N type P-type doped substrates, such as lightly N type P-type doped substrates (FIGS. 6 and 7).

While the examples above have identified silicon as a substrate material, boron and arsenic as dopants, SiGe as a deposited material, trench isolation as a technique for electrical isolation of devices on substrate, and epitaxial deposition as a method for depositing the deposited material, other materials and techniques now known or later discovered may be employed where suitable and/or desirable within the scope of the invention disclosed and claimed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device manufacturing method comprising:
    providing a substrate;
    defining a first region of the substrate and a second region of the substrate;
    doping the first region of the substrate with a P-type dopant in a first concentration;
    exposing a surface of the substrate of the first and second regions to a deposition stream of silicon germanium (SiGe) for at least a predetermined period determined responsive to at least the first concentration so that a layer of SiGe forms on the first region during the predetermined period with substantially no deposition of SiGe on the second region.

2. The method of claim 1, wherein the first region includes at least one of a source and a drain of a field effect transistor (FET) and the second region is a channel region of the FET.

3. The method of claim 1, further comprising doping the second region with a N type dopant in a second concentration.

4. The method of claim 3, wherein the substrate is silicon and the N-type dopant is arsenic so that substantially no SiGe is deposited on the second region during the predetermined period while a layer of SiGe forms on the first region.

5. The method of claim 1, wherein the doping the first region is part of forming a first FET in the first region, and the defining a second region is part of forming a second FET in the second region of the substrate, the method further comprising:
    doping the second region with a N-type dopant at a second concentration; and
    wherein the exposing includes exposing the first and second FETs to silicon germanium (SiGe) for a predetermined period, the predetermined period being determined responsive to at least one of the first and second concentrations.

6. The method of claim 5, wherein the exposing further includes epitaxial deposition of SiGe.

7. The method of claim 5, further comprising separating the first and second FETs by forming a trench isolation region.

8. The method of claim 5, wherein the layer of SiGe is part of a channel of one of the first and second FETs.

9. The method of claim 1, wherein the substrate is silicon and the predetermined period is about 22 seconds.

10. The method of claim 9, wherein the layer of SiGe is from about 5 Angstroms to about 25 Angstroms thick.

11. A method to process a substrate comprising:
    providing a substrate with an exposed surface;
    forming a first FET region in the exposed surface;
    forming a second FET region in the exposed surface;
    doping source and drain regions of the first FET region with a first dopant, the first dopant being one of a P-type dopant, to form a first doped area; and
    exposing the exposed surface to deposition of silicon germanium (SiGe) for at least a predefined period such that:
    responsive to the first dopant being a P-type dopant, a layer of SiGe forms on the first doped area while substantially no SiGe is deposited on the remainder of the exposed surface; and
    responsive to the first dopant being an N-type dopant, substantially no SiGe is deposited on the first doped area while a layer of SiGe forms on the remainder of the exposed surface.

12. The method of claim 11, further comprising:
    forming an NFET in the first FET region using the source and drain regions, the first dopant being an N-type dopant, including forming a SiGe plug in a channel of the NFET from the SiGe layer; and
    forming a PFET in the second FET region, including doping source and drain regions of the second FET region with a P-type dopant and forming a SiGe channel of the PFET from the SiGe layer.

13. The method of claim 12, further comprising oxidizing the PFET, resulting in an increase in a germanium (Ge) concentration in the SiGe layer.

14. The method of claim 12, further comprising forming a trench isolation region between the NFET and the PFET.

15. The method of claim 14, wherein the forming a trench isolation occurs prior to the exposing.

* * * * *